United States Patent
Brandt

(10) Patent No.: US 9,107,171 B2
(45) Date of Patent: Aug. 11, 2015

(54) METHOD AND APPARATUS FOR ADJUSTING TRANSMITTER POWER LEVEL

(75) Inventor: Seemal Naphade Brandt, Farnborough (GB)

(73) Assignee: Nokia Technologies Oy, Espoo (FI)

(*) Notice: Subject to any disclaimer, the term of this patent is extended or adjusted under 35 U.S.C. 154(b) by 62 days.

(21) Appl. No.: 13/884,450

(22) PCT Filed: Nov. 15, 2010

(86) PCT No.: PCT/FI2010/050916
§ 371 (c)(1),
(2), (4) Date: Jun. 3, 2013

(87) PCT Pub. No.: WO2012/066180
PCT Pub. Date: May 24, 2012

(65) Prior Publication Data
US 2013/0267182 A1    Oct. 10, 2013

(51) Int. Cl.
*H04B 7/00*     (2006.01)
*H04W 52/18*    (2009.01)
*H03G 3/30*     (2006.01)

(52) U.S. Cl.
CPC ............. *H04W 52/18* (2013.01); *H03G 3/3042* (2013.01)

(58) Field of Classification Search
CPC ................................ H04W 52/00; H04W 52/18
USPC ........... 455/114.1, 126, 127.1, 522, 69, 556.1
See application file for complete search history.

(56) References Cited

U.S. PATENT DOCUMENTS

| | | | |
|---|---|---|---|
| 7,415,262 B2 * | 8/2008 | Liu et al. | 455/318 |
| 7,738,904 B1 * | 6/2010 | Chien et al. | 455/522 |
| 7,873,334 B2 * | 1/2011 | Itkin et al. | 455/126 |
| 8,131,230 B2 * | 3/2012 | Xhafa et al. | 455/110 |
| 8,140,105 B2 * | 3/2012 | Bjorken et al. | 455/522 |
| 2009/0052575 A1 | 2/2009 | Waheed et al. | |

FOREIGN PATENT DOCUMENTS

| | | |
|---|---|---|
| EP | 1215816 A2 | 6/2002 |
| EP | 1398874 A1 | 3/2004 |
| WO | 0167621 A2 | 9/2001 |

OTHER PUBLICATIONS

International Search Report and Written Opinion received for corresponding Patent Cooperation Treaty Application No. PCT/FI2010/050916, dated Sep. 12, 2011, 13 pages.

* cited by examiner

*Primary Examiner* — Sonny Trinh
(74) *Attorney, Agent, or Firm* — Locke Lord LLP

(57) ABSTRACT

According to one exemplary embodiment of the present invention, an apparatus is provided comprising a radio transmitter having an output stage with an adjustable output power level, a measurement circuit configured to measure a radio signal power of the radio transmitter and a control block connected to the measurement circuit wherein the measurement circuit is connected to the output stage of the radio transmitter where the radio signal power is measured; and wherein the control block is configured to adjust the output power level of the radio transmitter based on the measured radio signal power at the radio transmitter output stage.

8 Claims, 6 Drawing Sheets

100 – Host / Mobile phone
102 – Control unit
110 – Memory
120 – Battery
109 – Energy Mgt. Circuit
108 – Charging connector
130 – Cellular transmitter
140 – Cellular receiver
132 – Cellular antenna
160 – FM transmitter
162 – FM transmitter antenna
180 – Display
190 – Input devices (keyboard/touchpad)
150 – Audio circuitry
154 – Audio in/out internal
158 – Microphone
156 – Loudspeaker
152 – Audio in/out external 200 – Host / Mobile phone
202 – Processor
210 – Memory
260 – FM transmitter
262 – FM transmitter antenna
261 – FM TransmitterRF transmitter circuit
269 – measurement circuit
263 - Transmitter RF output stage
264 – antenna matching circuit
265 – Timer
266 – Data storage & processing unit
267 – control circuit
268 – FM transmitter output
204 – Digital Signal Processor 300 – Host / Mobile phone
302 – Processor
310 – Memory
360 – FM transmitter
362 – FM transmitter antenna
361 – FM TransmitterRF transmitter circuit
369 – measurement circuit
363 - Transmitter RF output stage
364 – antenna matching circuit
365 – Timer
366 – Data storage & processing unit
367 – control circuit
368 – FM transmitter output
304 – Digital Signal Processor

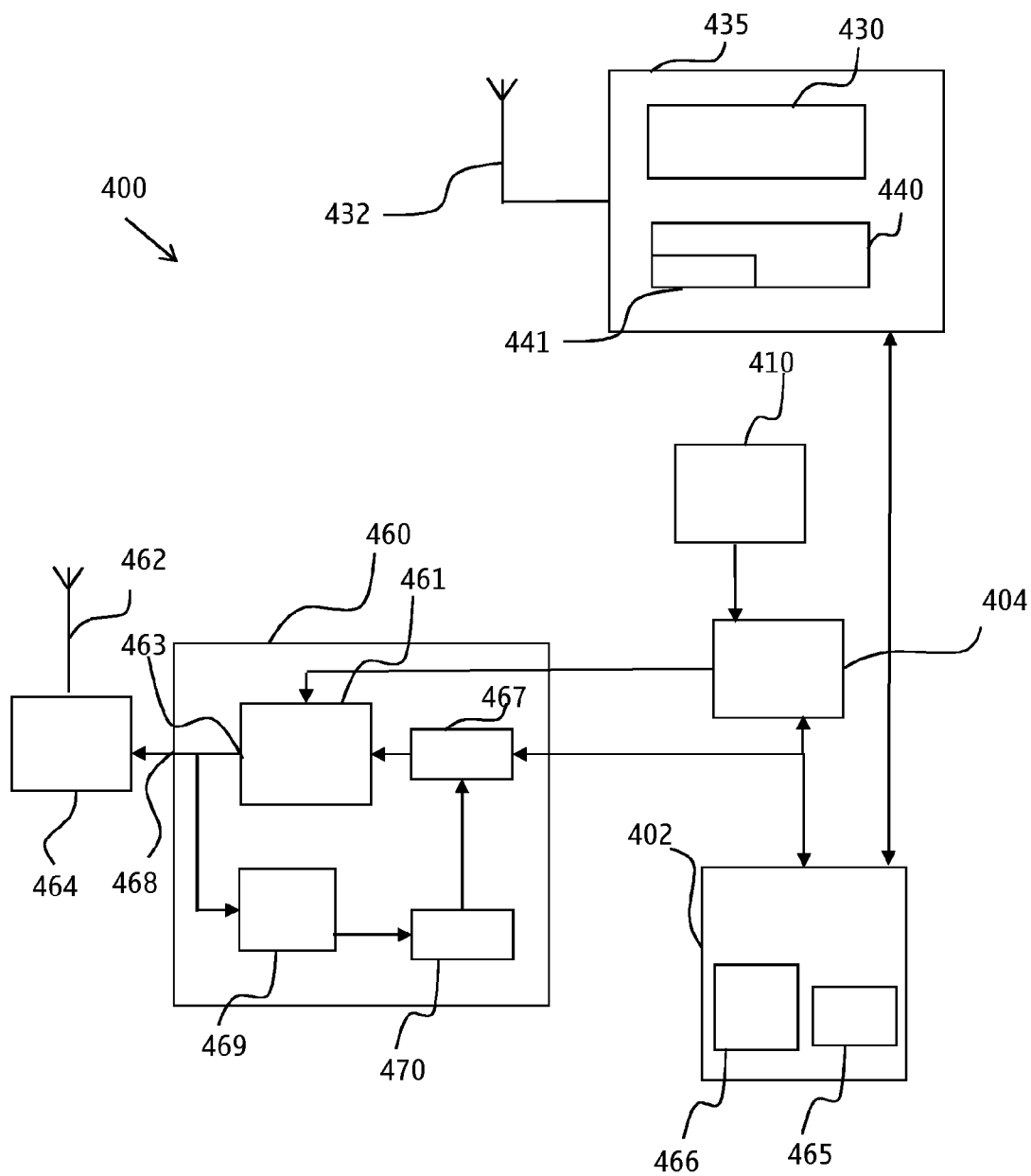

Fig. 4

400 – Host / Mobile phone
402 – Processor
410 – Memory
460 – FM transmitter
462 – FM transmitter antenna 435 Cellular transceiver
430 Cellular transmitter
440 Celluar receiver
441 measurement circuit
432 Cellular antenna 461 – FM TransmitterRF transmitter circuit
469 – measurement circuit
463 - Transmitter RF output stage
464 – antenna matching circuit
465 – Timer
466 – Data storage & processing unit
467 – control circuit
468 – FM transmitter output
404 – Digital Signal Processor

METHOD AND APPARATUS FOR ADJUSTING TRANSMITTER POWER LEVEL

RELATED APPLICATION

This application was originally filed as Patent Cooperation Treaty Application No. PCT/FI2010/050916 filed Nov. 15, 2010.

TECHNICAL FIELD

The present application relates generally to a method and apparatus for measuring a radio signal power, particularly the measurement of the radio signal power of a FM (Frequency Modulation) transmitter and adjusting the output power level based on the measured radio signal power.

BACKGROUND

Nowadays low range FM radio transmitters are commonly used for transmitting e.g. music which is stored in the memory of a device, which is equipped with such a FM transmitter. The music or other audio content is transmitted to a users car radio or home stereo equipment for reproduction by this equipment. Such kind of FM transmitters might be stand alone FM transmitters with integrated memory for storing music or the FM transmitter includes an interface for connection to an external memory. The FM transmitter my also be integrated into mobile communication devices, such as mobile phones incorporating a memory which stores e.g. music for playback.

FM transmitters were historically not allowed in many countries some time ago because they transmit FM radio signals like any FM radio broadast station in the same frequency range in order to facilitate receipiton of the transmitted signal by standard FM radio receivers. During the last couple of years FM radio transmitters were allowed for private use but they need to fulfill certain regulatory requirements in order not to interfere with each other and particularly not interfere with FM broadcast radio stations and other telecommunication systems.

The legal status of FM transmission varies around the world today and its limits of operation set by the regulatory bodies differ from country to country, e.g. while some countries do not allow FM transmission, the power is limited to 50 nW by ETSI (European Telecomunications STandardisatin Institute) in Europe, 250 uV/m@3 m by FCC (Federal Communication Commission) in the USA, and recent regulations in China limit the output power of FM transmitters to 45 nW ERP (Effective Radiated Power.

SUMMARY

Various aspects of examples of the invention are set out in the claims.

According to a first aspect of the present invention, an apparatus is provided comprising a radio transmitter having an output stage with an adjustable output power level, a measurement circuit configured to measure a radio signal power of the radio transmitter and a control block connected to the measurement circuit wherein the measurement circuit is connected to the output stage of the radio transmitter where the radio signal power is measured; and wherein the control block is configured to adjust the output power level of the radio transmitter based on the measured radio signal power at the radio transmitter output stage.

The control block may comprise a timer circuit for triggering the radio signal power measurement in intervals; a data storage for storing at least one previous radio signal power measurement result; and a control circuit for determining the difference between the radio signal power measurement results of the previous radio signal strength measurement and a current radio signal power measurement result.

The control circuit may be configured to compare the current radio signal power measurement result to a predefined power level limit.

The control circuit may further be configured to reduce the output power level of the radio transmitter if the radio signal power measurement result is above the predefined power level limit.

The apparatus my further reduce the output power level of the radio transmitter if the radio signal power measurement result is above the predefined power level limit.

The timer circuit and/or the data storage may be integral parts of a radio transmitter integrated circuit.

The timer circuit and the data storage may be integral parts of a host system wherein a radio transmitter integrated circuit is incorporated.

An apparatus according to the first embodiment of the invention may further comprise a cellular receiver comprising a radio signal power measurement circuit configured to measure the radio signal power of higher level harmonic frequencies transmitted by the radio transmitter and a processor for determining if the radio signal power of higher level harmonic frequencies interfere with frequencies used by the cellular receiver and for adjusting frequency and/or output power level of the radio transmitter According to a second aspect of the present invention a method is provided comprising:
  transmitting a radio transmission from a radio transmitter with a pre-set power level;
  measuring a radio signal power at an output stage of the radio transmitter;
  determining if the radio signal power at the output stage of the radio transmitter is above a power level limit; and
  reducing the pre-set power level of the radio transmitter if the measured radio signal power is above the power level limit.

The method may further comprise looping back to measuring the radio signal power until the measured radio signal power is above the power level limit.

The method may further comprise:
starting a timer with a pre-defined value after elapse of the timer reading the radio signal power at the output stage of the radio transmitter; updating the read radio signal power in a radio signal strength data storage and if a currently measured radio signal power is substantially equal to a previously stored radio signal power, looping back to starting the timer.

The method may further comprise:
determining if the newly measured radio signal power is below the originally set output power level;
determining if the newly measured radio signal power is below a power level limit then looping back to starting the timer.

The method may further comprise:
calculating a difference between the radio signal power measurement result and the pre-defined power-level limit; and calculating a new power-level by subtracting the calculated difference between the radio signal strength measurement result and the pre-defined power level-limt from the pre-set power level.

According to a third aspect of the present invention, an apparatus is provided comprising means for transmitting a radio signal having an output stage with an adjustable output power level means for measuring a radio signal power of the transmitting means; and means for controlling connected to the measuring means; wherein the measuring means is connected to the output stage of the transmitting means where the radio signal power is measured; and wherein the controlling means is configured to adjust the output power level of the radio transmitter means based on the measured radio signal power at the radio transmitter output stage.

According to a fourth aspect of the present invention a computer program is provided, comprising:

code for transmitting a radio transmission from a radio transmitter with a pre-set power level;

code for measuring a radio signal power at an output stage of the radio transmitter;

code for determining if the radio signal power at the output stage of the radio transmitter is above a power level limit; and code for reducing the pre-set power level of the radio transmitter if the measured radio signal power is above the power level limit.

BRIEF DESCRIPTION OF THE DRAWINGS

For a more complete understanding of example embodiments of the present invention, reference is now made to the following descriptions taken in connection with the accompanying drawings in which:

FIG. 4 shows a block diagram according to a third exemplary embodiment of the invention

DETAILED DESCRIPTON OF THE DRAWINGS

An example embodiment of the present invention and its potential advantages are understood by referring to FIGS. 1 through 6 of the drawings.

Figure 1:
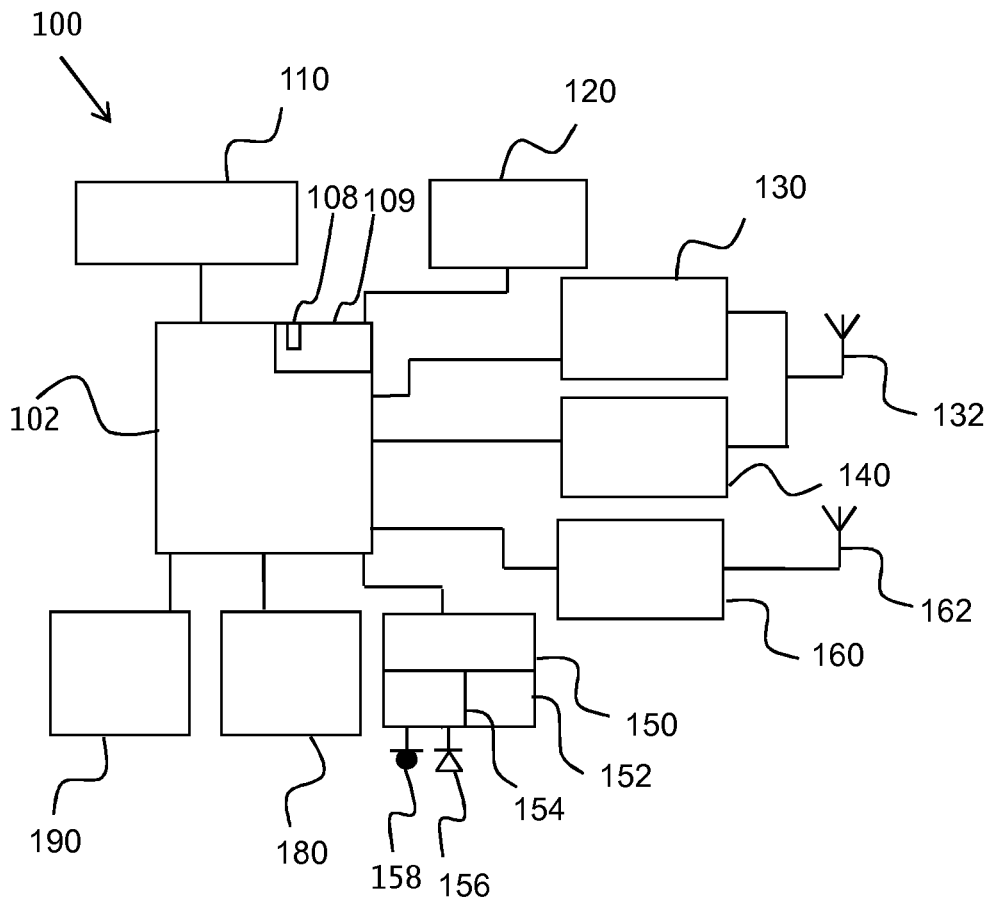
FIG. 1 shows a mobile communication device according to an exemplary embodiment of the invention.

FIG. 1 shows a mobile communication device 100 including a processor 102 connected to a memory 110. The memory 110 may contain music data files to be played back by the mobile communication device 100. The memory might be a removable memory card, such as an SD card or consisting of a RAM memory installed in the device being extended with a removable memory card or any other memory combination. The mobile communication device is powered by a battery 120. The power supply and charging of the device 100 is regulated by an energy management circuit 109. The energy management circuit 109 is connected to a charging connector 108, which can be connected via a cable to a charger for charging the battery (not shown). The mobile communication device 100 further contains a cellular transmitter 130 and a cellular receiver 140 for enabling voice and data communication with cellular networks through antenna 132. Such networks might be based on GSM (Global System for Mobile Communications), UMTS (Univeral Mobile Telephony System) and other current or future cellular communications systems. The mobile communication device 100 might contain several different cellular transmitters 130, cellular receivers 140 and antennas 132 supporting different communication technologies. The mobile communication devices might also contain short range and medium range transceivers like Blueooth and WLAN transceivers.

The mobile communication device 100 further contains in- and output devices such as an input device 190 which may be a keyboard or a touchpad for entering information or dialing phone numbers. Further a display 180 is connected to the processor 102.

The mobile communication device might further contain audio circuitry 150, connected to an internal loudspeaker 156 and internal microphone 158 through audio circuity 154. The audio circuitry 150 might also be connected to further audio circuitry 152 for connecting a headset, including earpiece and microphone, or a headphone to the mobile communication device 100.

According to this exemplary embodiment of the invention the mobile communication device comprises a FM transmitter 160, connected to an antenna 162 which is incorporated into the mobile communication device 100. The FM transmitter 160 is used for transmitting e.g. pieces of music, stored within memory 110 to any FM receiver in the local environment, e.g. a radio receiver in a car, where the user wants to enjoy the music stored on the mobile communication device, through the users car stereo audio system. The transmission power of the FM transmitter 160 can be adjusted based on the detected output power of the transmitter, as described more detailed in connection with the following figures.

It is found that when an accessory with a cable, such as a battery charger, USB data cable, headset, headphone or an Audio/Video cable, which is often about 1 meter long, is connected to the mobile communication device 100 while the FM transmitter 160 is transmitting, the cable serves as an antenna providing additional coupling and re-radiation of the power ratdiated by the FM transmitter 160, thus increasing the effective radiated power of the FM transmitter 100 above the permissible limits allowed by regulatory bodies.

Generally speaking, in radio telecommunications, effective radiated power or equivalent radiated power (ERP) is a standardized theoretical measurement of radio frequency (RF) energy using the SI unit watts. ERP takes into consideration transmitter power output (TPO), transmission line attenuation (electrical resistance and RF radiation), RF connector insertion losses, and antenna directivity. ERP is typically applied to antenna systems.

In the following description of embodiments of the invention the term "radio signal power" is used as an equivalent to the ERP, while the term "output power level" is the level which is set by the FM transmitter.

Even though the legal status of FM transmission varies around the world and its limits of operation set by the regulatory bodies differ from region to region, these limits have to be met at all times, also when any sort of accessory is attached to the product.

In FIG. 2-6 together with the following description, several embodiments are presented for the measurement of the radio signal power and the corresponding adjustment of the output power level of the FM transmitter 160 according to different exemplary embodiments of the invention.

In the following drawings the mobile communication device 100 is named host system. The reason is, that the output power adjustment of the FM transmitter 160 can be done in a "host independent mode", i.e. the FM transmitter 100 determines the radio signal power itself and adjust the output power level. The adjustment can also be done in co-operation with the host device, like the mobile communication device 100, where the FM transmitter 160 is embedded in. Embodiments according to this embodiment are called the "host dependend mode" for this reason.

Figure 2:
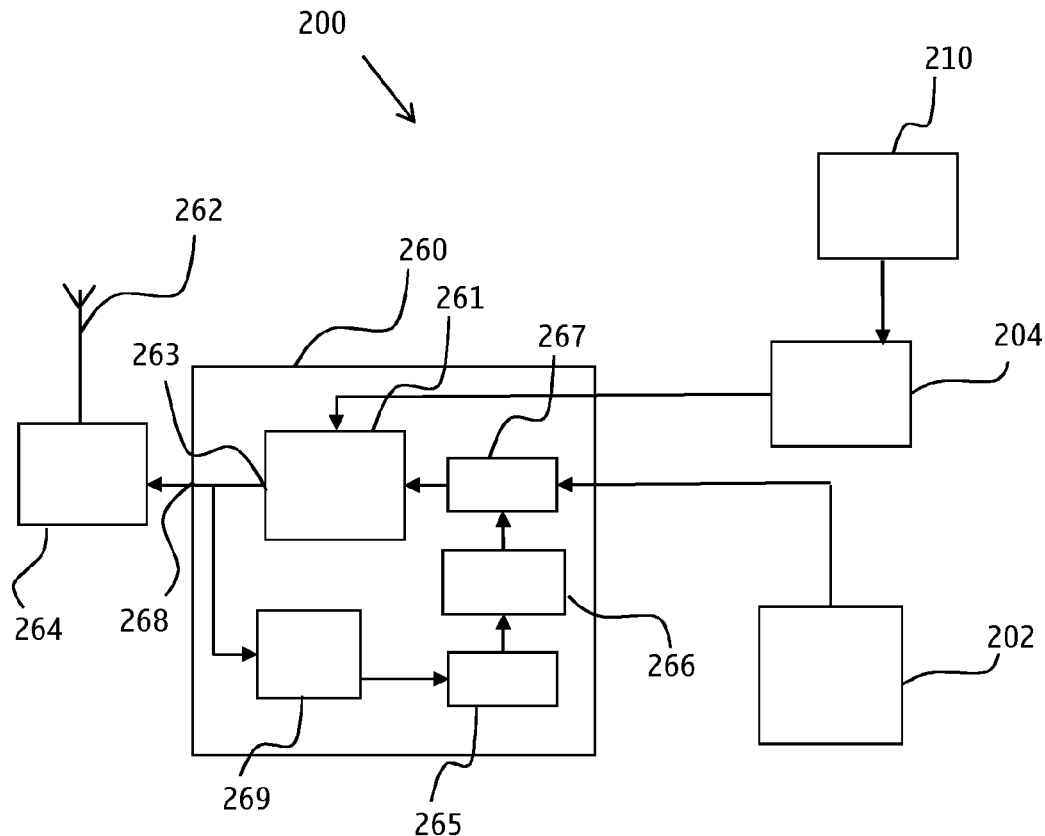
FIG. 2 shows a block diagram according to a first exemplary embodiment of the invention.

FIG. 2 shows a block diagram supporting a host independent mode according to an exemplary embodiment of the invention. As briefly already explained above, "host independend mode" means, that the mobile communication device 200 (host) is not involved in the output power level adjustment of the FM transmitter 260.

The host device 300 comprises, besides the processor 202, a Digital Signal Processor 204, which may convert e.g. digital MP3 files from the memory to 210 to analog music signal which are provided to the FM transmitter 260 for wireless short-range broadcasting.

The only function of the processor 202 may be to turn on and off the FM radio transmitter 260 by sending control signals to the control circuit 267.

According to this exemplary embodiment of the invention, the FM transmitter 260 contains a radio transmitter 261 having an output stage 263 with an adjustable output power level and a measurement circuit 269. The measurement circuit 269 might be a conventional Radio Signal Strength Indication circuit (RSSI circuit) as known by a person skilled in the art. The measurement circuit 269 and radio transmitter 261 are both connected to an antenna matching circuit 264 and the antenna matching circuit 264 is coupled to the FM transmitter antenna 262 at its output. The antenna matching circuit might be part of the FM transmitter 260, or a part of the host device 200, as shown in FIG. 2.

The measurement circuit 269 is usually used for the purpose of detecting free available frequencies in the FM frequency range, i.e frequencies which are not used by a public FM radio basestation in this region, and are therefore available for local FM transmission by the FM transmitter 260. Therefore FM transmitter devices are capable of acquiring the signal strength of a signal received through the antenna 262 by changing to receive mode for a short period of time.

The measurement circuit 269 according to this exemplary embodiment of the invention measures in addition to the availability of free FM frequencies, the radiated radio signal power of the FM RF transmitter circuit 261 at the same time when the radio transmitter 260 is radiating a low power FM radio signal. The radio signal power measurement is done at the output stage 263 of the radio transmitter 261. This is shown for illustrative purposes only. In practice it would be the same whether the radio signal power is measured at point 268 or the FM RF transmitter output stage 263. The radiated power might also be measured at the antenna port of the antenna matching circuit 264. The only difference is, that a reduction (or increment) amount of power will have to be considered by the loss caused by the matching circuit 264 if it is included when measurement is done at the antenna port of the matching circuit 264 and vice versa.

The output of the measurement circuit 269 is connected to the timer 265. The timer 265 initiates the radio signal power measurements by the measurement circuit 269 in certain intervals. When no accessory or other device is connected by a cable to the mobile communication device 100, or no other cable or metal object is in the vicinity of the host device 260, the measured radio signal power value will be approximately the same as the output power level of the radio transmitter 261, with sufficient margin to the regulatory limit. In normal operation the radio signal power might be monitored every 2-5 minutes. The measurement intervals may be controlled by the timer circuit 265. This period is selected such as to maintain optimum power consumption and still be able to detect an overly high radio signal power in a reasonable amount of time for fulfilling the requirements of regulatory bodies. This means that the timer intervals might also be different from country to country, if different regulations apply for these countries, i.e. they might also be much shorter, in the area of seconds or even less.

The obtained radio signal power value may be recorded in a data storage and processing block 266, which is read out by the FM Tx control circuit 267 for comparing consecutive radio signal power values in the host independend mode in accordance with FIG. 2.

The invention may be implemented without the need to store the radio signal power measurement results because in case the measurement result indicates that the radio signal power is above a certain (allowed) threshold, the control unit 267 might just send a control signal to the FM RF transmitter circuit 261 for reducing the transmitted output power by a certain value. The radio transmitter circuit 261 may for example receive instructions to reduce the output power as much as the measured radio signal power is above a given threshold for reducing the radio signal output to a value being within given regulatory limits. The reason for storing and comparing the radio signal power measurement values will become more apparent in connection with the flow chart of FIG. 5 and the accompanying description.

In the host independent mode in accordance with FIG. 2, the mobile communication device 200 (host) may further comprise a digital signal processor 204, connected to a memory 210 and a processor 202. The control unit 210 turns the FM transmitter 260 on and off by sending a corresponding control signal to the FM transmitter control unit 267, depending on the need to transmit FM radio signals as indicated by the user of the device 200.

The digital signal processor 204 in connection with the memory 210 provides the audio output signal to the radio transmitters 261 for transmitting the audio signal as a low-power FM radio signal via output stages 264 and 262.

Even though the host device 100 controls the FM transmitter 160 in this mode, the transmit power of the radio transmitter is only measured and adapted by means within the FM transmitter 260.

Figure 3:
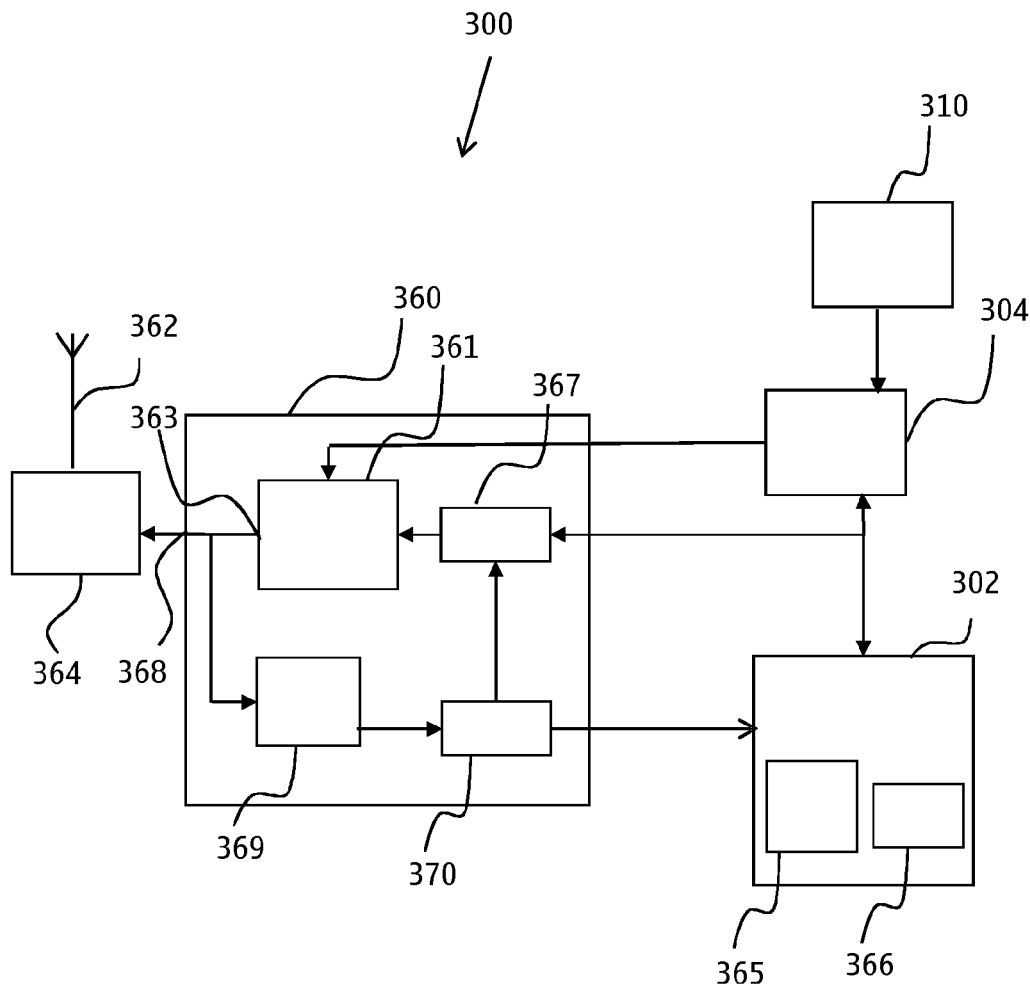
FIG. 3 shows a block diagram according to a second exemplary embodiment of the invention

FIG. 3 shows another exemplary embodiment of the present invention where the host device 300 is involved in the control and adjustment of the output power of the radio transmitter 361, which is therefore called the "Host dependent mode".

The building blocks 364, 361, 367, 369 of FIG. 3 are having basically the same functionality as the corresponding blocks in FIG. 2 but the timer circuit 265 of FIG. 2 is now part of the processor 302 of the host device with block number 365. Further the data storage and data processing unit 266 of FIG. 2 is integrated into the processor 302 with block number 366. According to this exemplary embodiment the FM transmitter 360 may further contain a data register 370 for storing and providing the radio signal measurement results but also the data register 370 might be a part of the host device 300 and not integrated to the FM transmitter 360.

In accordance with the exemplary embodiment of FIG. 3 the radio signal power is measured by the measurement circuit 369 similar to the embodiment according to FIG. 2 but the radio signal power measurement results are stored in the data register 370 and handed over to the data storage and data processing device 366, being part of the processor 302.

The interval of the radio signal strength measurements by the measurement circuit 369 is determined and provided by the timer circuit 366 for the measurement circuit 369.

The subsequently received radio signal power measurement results are analyzed by processor 302 and the analysis result is used to adjust the output power of the FM transmitter circuit 361 through the FM transmitter control circuit 367. I.e. once the processor 302 determines that the measured radio signal at the FM transmitter output stage 363 is above an allowed limit, the output power is reduced.

Compared to the host independend mode of FIG. 2, in the host dependend mode of FIG. 3, the processor 302 does not only turn the FM transmitter on and off but also controls the power output of the FM transmitter RF circuit 361, while in the host independend mode of FIG. 2, the FM transmitter 260 determines and adjusts the output power settings of the FM transmitter circuit 261 itself.

In FIG. 4 a further exemplary embodiment of the invention is shown. In addition to FIG. 3, a GSM transceiver unit 435 containing a GSM transmitter 430 and a GSM receiver 440, which are both connected to a common antenna 432 are part of this embodiment of the invention. The GSM receiver 440 contains a measurement circuit 441. This measurement circuit 441 is a commonly known part of GSM receivers for measuring the radio signal strength of received signal in the GSM band and the measurement result may be used for adjusting the internal amplification of the received GSM signal.

The embodiment of FIG. 4 handles a coexistence scenario when the FM transmitter output power needs to be adjusted when out_of_band emissions of FM transmitter harmonics falling in GSM bands are too high. For example if the FM transmitter 460 transmitts at a frequency of 95 MHz, which is having its 10th harmonic, i.e. 950 MHz, in the GSM band, is too high, then the output power of the FM transmitter RF circuit 461 has to be backed off in order to ensure reliable receiption at the GSM receiver 440.

This requires a radio signal measurement to be trigerred e.g. by the processor 402, at the GSM receiver 440 at a predetermined harmonic frequency of the FM transmitter 460. For this purpose the GSM transceiver 435 is controlled by the control unit 402, which is aware of the currently used FM transmitter frequencies and can control the measurement frequencies, which are to be measured for determining the strength of the harmonic frequencies of the FM transmitter 460 at the GSM receiver 440.

The signal strength of the harmonic frequencies of the FM transmitter 460 might not disturb the GSM receiption as long as the FM transmitter output signal is transmitted via its internal antenna 462 only, but once a cable is connected to the device 400, the FM transmitter signal output might be above an acceptable threshold for the GSM receiver 440 and disturb the GSM signal receiption. This threshold might be below any regulatory limit for the FM transmitter transmission, but still disturbing the GSM signal receiption.

In case it is determined that the signal strength of signal transmitted by FM transmitter 460, which is measured at the GSM receiver by the GSM measurement circuit 441, is above a threshold, the control unit 467 is instructed by the processor 402 to either reduce the output power of the FM transmitter RF circuit or to switch to another available FM transmitter channel which is determined to be free for use by the measurement circuit 469, because no radio signal from a FM radio base station can be determined on such channel.

Figure 5:
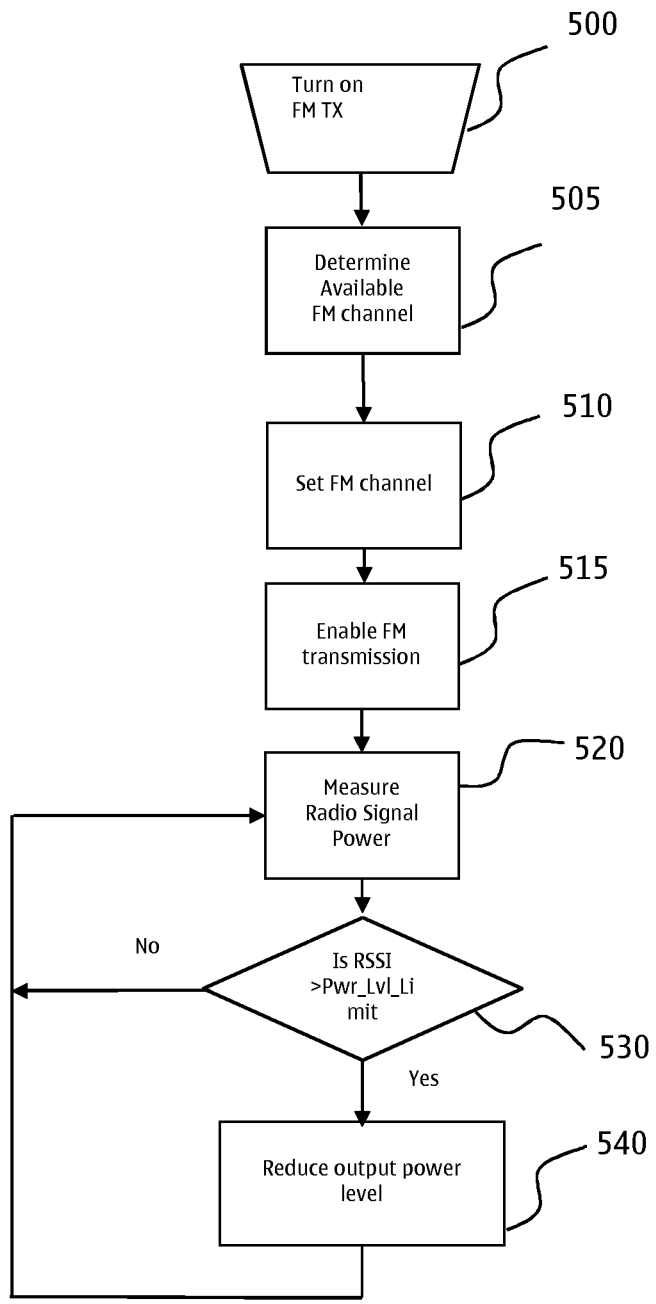
FIG. 5 shows a first flow chart according to an exemplary embodiment of the invention
Figure 6:
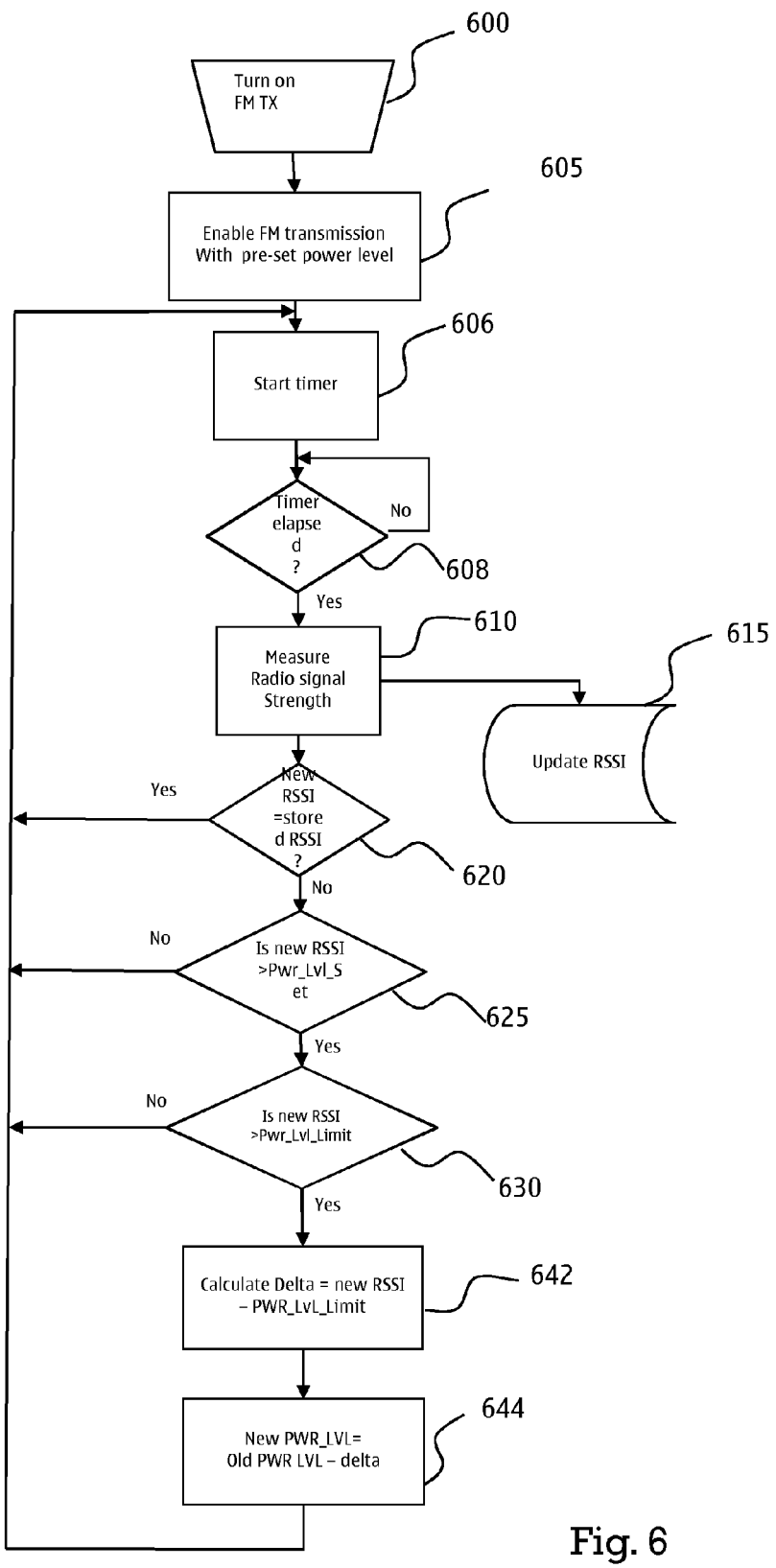
FIG. 6 shows another flow chart according to an exemplary embodiment of the invention

FIG. 5 shows a flow chart according to a first exemplary embodiment of the invention. Even though in the following the flowchart is described in connection with the embodiment of FIG. 2, this flowchart and the flowchart of FIG. 6 is also applicable to the embodiments of FIGS. 1, 3 and 4.

In step 500 the FM transmitter (FM Tx) 260 is turned on. In step 505 an available FM radio channel for FM transmission is determined by scanning through the FM radio channels using the measurement circuit 269 in a conventional manner, i.e. while the FM RF transmitter circuit is not transmitting a FM radio signal. With the start of the FM transmission a FM transmitter output power level is chosen which is usually within the regulatory limits as long as no cable or accessory is connected to the device 100. Once an available free radio channel for FM transmission is identified, the FM channel is set in step 510 and the FM transmission is enabled in step 515.

In step 520 the radio signal power at the output of the FM transmitter RF circuit is measured with the measuring device 269 during the ongoing FM signal transmission. As long as the measured level is determined to be below a defined radio signal power level limit, as defined e.g. by regulatory bodies, (e.g. below 250 uV/m@3 m if the device is operated in the United States of America under current FCC regulations) in step 530, the process returns to step 520. This might be done immediately, for a continous measurement of the output power level, but the measurement might only be repeated in time intervals with some seconds or even minutes between the measurements for saving battery power.

In case it is determined in step 530 that the measured output power level is above a determined threshold, as defined by local regulations, the output power level is reduced in step 540. The output power reduction value might be chosen such, that the value, which the measured output power level is above the threshold, is reduced from the originally set output power level for just reaching the allowed output power level.

FIG. 6 shows a flowchart according to a further exemplary embodiment of the invention. In this flowchart it is taken into account that the measured output power level at the output of the FM transmitter RF circuit 261 increases typically stepwise when an accessory such as, not only an USB charger or USB data cable, but also AV Headset, HDMI cable, or normal DC charger, is connected to the mobile phone. This means, that the output power level may not be adapted always after minor changes in the determined output power level, but only when a larger step in the change of the output power level is determined, this step might e.g. be determined when an accessory cable is connected to device 200.

In step 600 the FM transmitter is turned on and in step 605 the FM transmission is enabled with a preset power level of the FM transmitter RF circuit. Before step 605 a step might be introduced similar to step 505 for the determination and setting of an available FM channel.

In step 606 a timer (265) is started which defines the period for the radio signal power measurements. In normal operation the radio signal power may be monitored every 2-5 minutes. The period is selected such as to maintain optimum power consumption and still be able to detect the attachement of an accessory or any other events increasing the radio output power level in a reasonable amount of time.

As long as it is identified in step 608 that the timer is not elapsed the process returns to step 608. Once the timer elapsed the process proceeds to step 610 and the radio signal power at the output stage 263 of the FM transmitter RF ciruit 269 is measured and the measured radio signal strength value is updated in step 615.

In case it is determined in step 620 that the newly measured radio signal power value is the same or nearly the same then the previously measured radio signal strength value, the process returns to step 606, but in case it is determined that the newly measured radio signal power level is higher then the previously measured radio signal power level the process proceeds to step 625, where it is determined if the newly measured power level is higher then the originally set output power level (Pwr_Lvl_Set). In case the newly measured radio signal power level is not greater then the originally set output power level of FM RF transmitter 261, the process returns to step 606, but in case the newly measured radio signal power level is higher then the set output power level, the process proceeds to step 630, where it is determined if the newly measured radio signal power level is above a power level limit (Pwr_Lvl_Limit) as it is defined by regulatory bodies. As long as the newly measured radio signal power level is below the power level limit, the process returns to step 605. In case the measured output power level is above an output power limit the process proceeds to step 642.

In step 642 a power level reduction value (Delta) is determined by subtracting the maximum power level value (Pwr level limit) from the newly measured radio signal power value.

In step 644 the new power level which is used to set the output power level of the FM transmitter RF 261 is determined by subtracting the power level reduction value (Delta) from the originally set power level (old Pwr Lvl). This way it is ensured that the power level, which is radiated by the FM transmitter 260, stays just below or is equal to the allowed power level and is not unnecessarily reduced to much for ensuring best possible FM reception and thereby user experience.

Even though the exemplary embodiments of the invention are described above with reference to a FM transmitter, the invention might also be implemented in the same or similar way for other digital or non-digital short range transmissions which might be developed in the future are already existent today. E.g. FM radio broadcasting might be relieved in the future and replaced by a digital radio broadcasting system like DAB (digital audio broadcasting) which might also be used for short range signal broadcasting for private use.

Further, e.g. the embodiment of FIG. 4 is described and shown with reference to a GSM transceiver, all kind of today and in the future used transceivers such as WCDMA, LTE, Bluetooth or WLAN might fall under the scope of this invention in connection with FIG. 4 in case the FM transmitter signal may interfere either directly or e.g. through higher level harmonic frequencies with such additional transceivers in a device.

Even though the exemplary embodiments are described mainly in connection with power level limitation and reduction, it should be understood that the concept of the invention may also be used for power level increase, when it it determined that the power level becomes too low for reliable FM radio signal transmission to FM receivers in the vicinity.

Embodiments of the present invention may be implemented in software, hardware, application logic or a combination of software, hardware and application logic. In an example embodiment, the application logic, software or an instruction set is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted in FIG. 1, 2, 3 or 4. A computer-readable medium may comprise a computer-readable storage medium that may be any media or means that can contain or store the instructions for use by or in connection with an instruction execution system, apparatus, or device, such as a computer.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The invention claimed is:

1. An apparatus, comprising:
a radio transmitter having an output stage with an adjustable output power level; the apparatus further comprising:
a coexisting cellular receiver comprising a radio signal power measurement circuit configured to measure radio signal power of higher level harmonic frequencies transmitted by the radio transmitter; and
a processor for determining if the radio signal power of higher level harmonic frequencies interfere with frequencies used by the cellular receiver and for adjusting frequency and/or output power level of the radio transmitter; and
a control block connected to the processor;
wherein the processor is connected to an output stage of the radio transmitter via the control block; and
wherein the control block is configured to adjust the output power level of the radio transmitter based on the measured radio signal power at the radio transmitter output stage.

2. The apparatus of claim 1, wherein the control bock comprises:
a timer circuit for triggering the radio signal power measurement in intervals;
a data storage for storing at least one previous radio signal power measurement result; and
a control circuit for determining the difference between the radio signal power measurement results of the previous radio signal strength measurement and a current radio signal power measurement result.

3. The apparatus of claim 2, wherein at least one of:
a) the control circuit is configured to compare the current radio signal power measurement result to a predefined power level limit,
b) the control circuit is configured to reduce the output power level of the radio transmitter if the radio signal power measurement result is above the predefined power level limit,
c) the control circuit is configured to reduce the output power level of the radio transmitter if the radio signal power measurement result is above the predefined power level limit,
d) the timer circuit or the data storage are integral parts of a radio transmitter integrated circuit,
e) the timer circuit and the data storage are integral parts of a host system wherein a radio transmitter integrated circuit is incorporated.

4. A method, comprising:
transmitting a radio transmission from a radio transmitter with a pre-set power level;
measuring a radio signal power at a coexisting cellular receiver comprising a radio signal power measurement circuit configured to measure radio signal power of higher level harmonic frequencies transmitted by the radio transmitter; and a processor for determining if the radio signal power of higher level harmonic frequencies interfere with frequencies used by the cellular receiver and for adjusting frequency and/or output power level of the radio transmitter by;

determining if radio signal power at an output stage of the radio transmitter is above a power level limit; and reducing the pre-set power level of the radio transmitter if the measured radio signal power is above the power level limit.

5. The method of claim 4 further comprising:
a) looping back to measuring the radio signal power until the measured radio signal power is above the power level limit,
or
b) starting a timer with a pre-defined value;
after elapse of the timer; reading the radio signal power at the output stage of the radio transmitter;
updating the read radio signal power in a radio signal strength data storage; and
if a currently measured radio signal power is substantially equal to a previously stored radio signal power, looping back to starting the timer,
or
c) determining if the newly measured radio signal power is below the originally set output power level; and
determining if the newly measured radio signal power is below a power level limit then looping back to starting the timer,
or
d) calculating a difference between the radio signal power measurement result and the pre-defined power-level limit; and
calculating a new power-level by subtracting the calculated difference between the radio signal strength measurement result and the pre-defined power level-limit from the pre-set power level.

6. A non-transitory computer readable storage medium in which computer program code is stored, the computer program code configured to cause an apparatus to perform the method of claim 4 when executed by a processor.

7. An apparatus, comprising:
means for transmitting a radio signal having an output stage with an adjustable output power level;
coexisting cellular means for receiving a radio signal power of the harmonics seen in a different band from the transmitting means;
means to measure said radio signal power of higher level harmonic frequencies transmitted by the radio transmitter; and
means for controlling connected to the measuring means;
wherein the measuring means is connected to an output stage of the transmitting means where the radio signal power is measured; and
wherein the controlling means is configured to adjust the output power level of the radio transmitter means based on the measured radio signal power at the input stage of the coexisting cellular receiver.

8. A non-transitory computer readable storage medium in which computer program code is stored, the computer program code comprising:
code for transmitting a radio transmission from a radio transmitter with a pre-set power level;
code for measuring a radio signal power at an input stage of a coexisting cellular receiver of the radio transmitter harmonics seen in a different band;
code for determining if the radio signal power as seen at the coexisting cellular receiver is above a power level limit; and
code for reducing the pre-set power level of the radio transmitter if the measured radio signal power is above the power level limit.

\* \* \* \* \*